(12) United States Patent
Kim et al.

(10) Patent No.: US 12,362,200 B2
(45) Date of Patent: Jul. 15, 2025

(54) SUPERCRITICAL FLUID PROCESSING APPARATUS AND SUBSTRATE PROCESSING SYSTEM INCLUDING THE SAME

(71) Applicant: SAMSUNG ELECTRONICS CO., LTD., Suwon-si (KR)

(72) Inventors: Seohyun Kim, Hwaseong-si (KR); Ohchel Kwon, Hwaseong-si (KR); Sangwoo Kim, Gimhae-si (KR); Youngchan Kim, Hwaseong-si (KR); Hyunchul Kim, Hwaseong-si (KR); Hyunwoo Nho, Yongin-si (KR); Jaeseong Ryu, Hwaseong-si (KR); Seungbu Baek, Hwaseong-si (KR); Yongmyung Jun, Hwaseong-si (KR); Hyeongkwon Jeong, Jeollanam-do (KR); Daewoong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 435 days.

(21) Appl. No.: 17/854,191

(22) Filed: Jun. 30, 2022

(65) Prior Publication Data
US 2023/0046595 A1    Feb. 16, 2023

(30) Foreign Application Priority Data
Aug. 12, 2021 (KR) .................. 10-2021-0106400

(51) Int. Cl.
*F26B 5/00*     (2006.01)
*H01L 21/02*    (2006.01)
*H01L 21/67*    (2006.01)

(52) U.S. Cl.
CPC ........ *H01L 21/67034* (2013.01); *F26B 5/005* (2013.01); *H01L 21/02057* (2013.01);
(Continued)

(58) Field of Classification Search
None
See application file for complete search history.

(56) References Cited

U.S. PATENT DOCUMENTS 6,841,031 B2    1/2005    Iwata et al.
9,275,847 B2    3/2016    Jung et al.
(Continued)

FOREIGN PATENT DOCUMENTS

KR    10-2009-0006270 A    1/2009
KR    10-2013-0052991 A    5/2013
(Continued)

*Primary Examiner* — Levon J Shahinian
(74) *Attorney, Agent, or Firm* — Muir Patent Law, PLLC

(57) ABSTRACT

A supercritical fluid processing apparatus including a supercritical fluid supply module including a gas liquefier to liquefy a gas transferred from a gas supply and provide a liquefied fluid, a storage tank to change the liquefied fluid to a supercritical state and store a supercritical fluid, and an internal pipe connecting the gas liquefier to the storage tank; an exhaust fluid supply module including an exhaust fluid liquefier including a regeneration storage tank to collect a first exhaust fluid from the storage tank, and a refrigerant pipe to liquefy the first exhaust fluid in the regeneration storage tank and maintain the liquefied first exhaust fluid at a predetermined temperature/pressure; a first exhaust pipe to transfer the first exhaust fluid from the storage tank to the exhaust fluid liquefier; and a resupply pipe to resupply the first exhaust fluid collected and liquefied in the exhaust fluid liquefier to the storage tank.

19 Claims, 10 Drawing Sheets

(52) U.S. Cl.
CPC .. *H01L 21/67017* (2013.01); *H01L 21/67028* (2013.01); *H01L 21/6708* (2013.01); *H01L 21/67253* (2013.01)

(56) References Cited

U.S. PATENT DOCUMENTS

| | | |
|---|---|---|
| 9,506,695 B2 | 11/2016 | Kim et al. |
| 2012/0048304 A1 | 3/2012 | Kitajima et al. |
| 2013/0319484 A1 | 12/2013 | Choi et al. |
| 2014/0290092 A1* | 10/2014 | Jung ............... B01D 53/04 34/570 |

FOREIGN PATENT DOCUMENTS

| | | |
|---|---|---|
| KR | 10-2015-0077536 A | 7/2015 |
| KR | 10-1910797 B1 | 10/2018 |

* cited by examiner

SUPERCRITICAL FLUID PROCESSING APPARATUS AND SUBSTRATE PROCESSING SYSTEM INCLUDING THE SAME

CROSS TO REFERENCE TO RELATED APPLICATION

This application claims benefit of priority to Korean Patent Application No. 10-2021-0106400 filed on Aug. 12, 2021, in the Korean Intellectual Property Office, the disclosure of which is incorporated herein by reference in its entirety.

BACKGROUND

1. Field

Embodiments relate to a supercritical fluid processing apparatus and a substrate processing system including the same.

2. Description of the Related Art

A semiconductor device may be manufactured through various manufacturing processes, such as a lithography process, an etching process, and an ion implantation process. A cleaning process and a drying process for removing impurities remaining on the surface of a wafer may be performed after each process is completed and before a subsequent process is performed.

SUMMARY

The embodiments may be realized by providing a supercritical fluid processing apparatus including at least one supercritical fluid supply module including a gas liquefier configured to liquefy a gaseous fluid transferred from a gas supply and provide a liquefied fluid, a storage tank configured to change the liquefied fluid to have a supercritical state and to store a supercritical fluid, and an internal pipe connecting the gas liquefier to the storage tank; an exhaust fluid supply module including an exhaust fluid liquefier including a regeneration storage tank configured to collect a first exhaust fluid discharged from the storage tank, and a refrigerant pipe configured to liquefy the first exhaust fluid collected in the regeneration storage tank and to maintain the liquefied first exhaust fluid at a predetermined temperature and pressure; a first exhaust pipe configured to transfer the first exhaust fluid discharged from the storage tank to the exhaust fluid liquefier; and a resupply pipe configured to resupply the first exhaust fluid collected and liquefied in the exhaust fluid liquefier to the storage tank.

The embodiments may be realized by providing a substrate processing system including a process apparatus configured to perform cleaning and drying processes on a substrate; and a supercritical fluid processing apparatus including a supercritical fluid supply module configured to supply a supercritical fluid to the process apparatus through an external pipe and including at least one storage tank configured to store the supercritical fluid, and an exhaust fluid supply module including an exhaust fluid liquefier configured to collect a first exhaust fluid discharged from the supercritical fluid supply module through a first exhaust pipe and to maintain the first exhaust fluid at a predetermined temperature and pressure, and an exhaust fluid pressure booster configured to transfer the first exhaust fluid collected in the exhaust fluid liquefier to the supercritical fluid supply module through a resupply pipe.

The embodiments may be realized by providing a substrate processing system including a loading apparatus configured to prepare a substrate to be processed; a process apparatus including a cleaning chamber configured to perform a cleaning process on the substrate, and a drying chamber configured to perform a drying process on the substrate; a supercritical fluid processing apparatus configured to store and supply a supercritical fluid for performing the cleaning process and the drying process; and an external pipe connecting the process apparatus to the supercritical fluid processing apparatus, wherein the supercritical fluid processing apparatus includes at least one supercritical fluid supply module including a gas liquefier configured to liquefy a gaseous fluid transferred from a gas supply and provide a liquefied fluid, a storage tank configured to change the liquefied fluid to have a supercritical state and to store a supercritical fluid, and an internal pipe connecting the gas liquefier to the storage tank; an exhaust fluid supply module including an exhaust fluid liquefier including a regeneration storage tank configured to collect a first exhaust fluid discharged from the storage tank, and a refrigerant pipe configured to liquefy the first exhaust fluid collected in the regeneration storage tank and to maintain the liquefied first exhaust fluid at a predetermined temperature and pressure, and an exhaust fluid pressure booster configured to transfer the first exhaust fluid from the exhaust fluid liquefier to the at least one supercritical fluid supply module; a first exhaust pipe configured to supply the first exhaust fluid from the storage tank to the exhaust fluid liquefier; and a resupply pipe configured to resupply the first exhaust fluid from the exhaust fluid liquefier to the storage tank.

BRIEF DESCRIPTION OF DRAWINGS

Features will be apparent to those of skill in the art by describing in detail exemplary embodiments with reference to the attached drawings in which.

DETAILED DESCRIPTION

Figure 1:
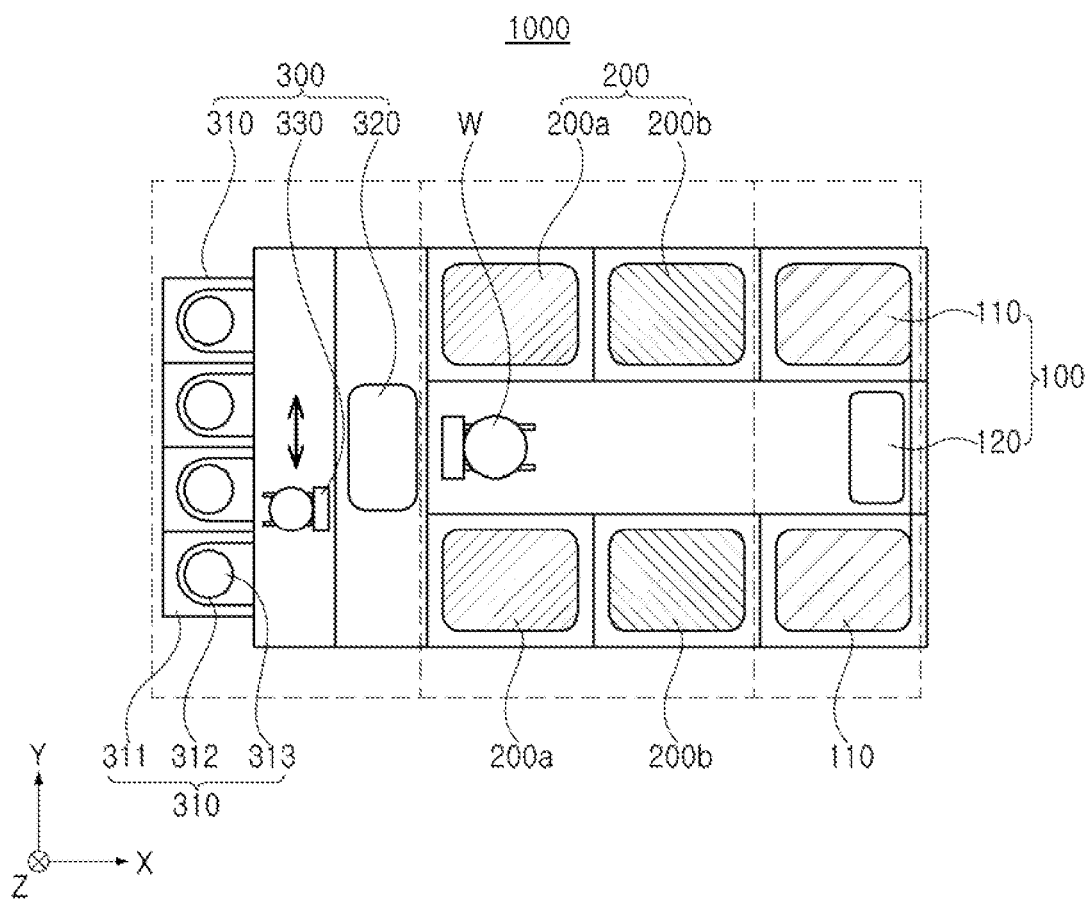
FIG. 1 is a diagram of a substrate processing system according to an example embodiment.
Figure 2:
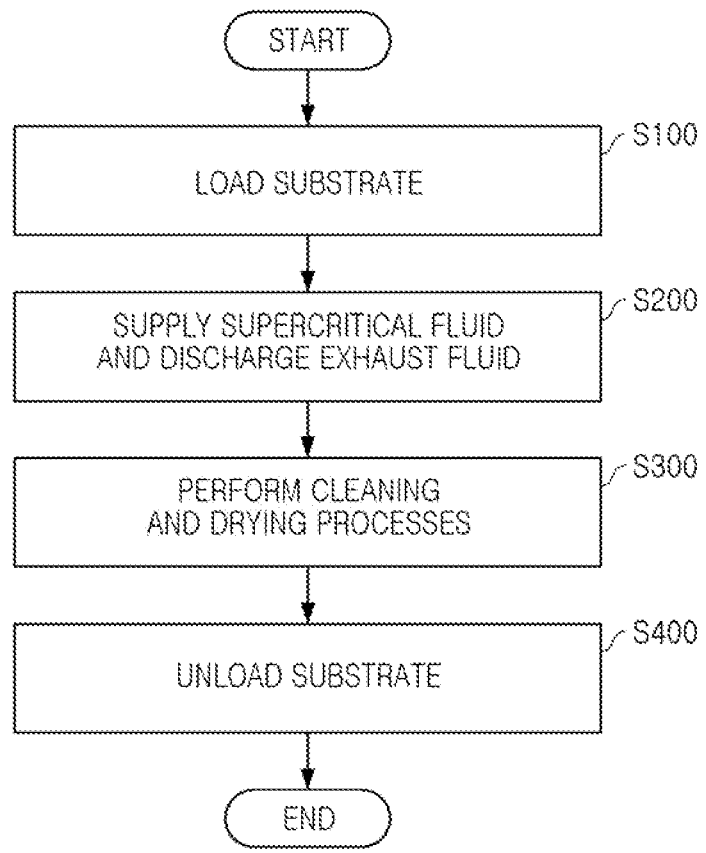
FIG. 2 is a flowchart of operations of a substrate processing system according to an example embodiment.

FIG. 1 is a diagram of a substrate processing system 1000 according to an example embodiment. FIG. 2 is a flowchart of operations of the substrate processing system 1000 according to an example embodiment.

Referring to FIG. 1, a substrate processing system 1000 according to an example embodiment may include a supercritical fluid processing apparatus 100, a process apparatus 200, and a loading apparatus 300. In an implementation, a cleaning process and a drying process for removing impurities remaining on the surface of the semiconductor substrate W may be performed on the substrate processing system 1000 after a predetermined semiconductor process for the semiconductor substrate W is terminated and before a subsequent process is performed.

A plurality of semiconductor process apparatuses including the substrate processing system 1000 may form various structures on the semiconductor substrate W by performing a plurality of semiconductor processes, thereby implementing a desired semiconductor device. The plurality of semiconductor processes may include, e.g., a deposition process, a chemical mechanical polishing (CMP) process, or an etching process for removing at least some of the device layers included in the semiconductor substrate W using an etchant. The substrate processing system 1000 may perform the cleaning process and the drying process for the semiconductor substrate W while the plurality of semiconductor processes are performed or after the plurality of semiconductor processes are completed.

The semiconductor substrate W may include a wafer formed of a semiconductor material such as silicon. Semiconductor devices, wiring patterns connected to the semiconductor devices, and insulating layers covering the semiconductor devices and the wiring patterns may be formed on the semiconductor substrate W by the plurality of semiconductor processes, and semiconductor chips may be produced from the semiconductor substrate W. In an implementation, an object to be processed may not be a wafer. In an implementation, the semiconductor substrate W may be implemented by various substrates other than a wafer, e.g., a mother substrate for a display.

The loading apparatus 300 may be configured to prepare the semiconductor substrate W to perform the cleaning process or the drying process. In an implementation, the loading apparatus 300 may include an index apparatus 310, a standby member 320, and a transfer robot 330.

The index apparatus 310 may load or unload the semiconductor substrate W. In an implementation, the index apparatus 310 may include a cassette stage 311 extending in one direction, e.g., a Y-direction. The cassette stage 311 may include a plurality of support plates 312. Each of the plurality of support plates 312 may include a wafer carrier 313 in which the plurality of semiconductor substrates W may be accommodated. The wafer carrier 313 accommodating the semiconductor substrate W may be transferred from the outside and may be loaded into the index apparatus 310, or may be unloaded from the index apparatus 310 and may be transferred externally.

The standby member 320 may be in an area adjacent to the index apparatus 310. The standby member 320 may be a member in which the semiconductor substrate W may wait or be held before the semiconductor substrate W is transferred from the wafer carrier 313 to the process apparatus 200.

The transfer robot 330 may be configured to transfer the semiconductor substrate W. The transfer robot 330 may transfer the semiconductor substrate W from the wafer carrier 313 to the standby member 320 along a predetermined transfer path. In an implementation, the transfer robot 330 may include a base movable along an index rail on the predetermined transfer path, a body coupled to the base and rotatable with respect to a Z-direction as an axis, and an arm coupled to the body and gripping the semiconductor substrate W.

In an implementation, the configuration and structure of the loading apparatus 300 may be varied.

The process apparatus 200 may perform cleaning and drying processes on the semiconductor substrate W. The process apparatus 200 may include a plurality of process chambers 200a and 200b. The plurality of process chambers 200a and 200b may be adjacent to the loading apparatus 300. The plurality of process chambers 200a and 200b may include a cleaning chamber 200a for performing a cleaning process on the semiconductor substrate W and a drying chamber 200b for performing a drying process thereon. In an implementation, a plurality of the cleaning chambers 200a and a plurality of the drying chambers 200b may be provided. In an implementation, the positions of the plurality of process chambers 200a and 200b and the numbers of the plurality of process chambers 200a and 200b may be varied.

In an implementation, the cleaning chamber 200a may perform a cleaning process on the surface of the semiconductor substrate W using pure water and isopropyl alcohol (IPA). After the cleaning process is completed, the drying chamber 200b may perform a drying process on the surface of the semiconductor substrate W using a supercritical fluid. As used herein, "a supercritical fluid" may be defined as a fluid in a supercritical state. In an implementation, the supercritical fluid for the drying process may include carbon dioxide.

In an implementation, the semiconductor substrate W may be transferred from the standby member 320 by the transfer robot and may move to the cleaning chamber 200a or the drying chamber 200b. In an implementation, the transfer robot may be different from the transfer robot of the loading apparatus 300, or the transfer robot may be the same as the transfer robot of the loading apparatus 300. The transfer robot may transfer the semiconductor substrate W from the standby member 320 to the cleaning chamber 200a or the drying chamber 200b in order along a predetermined transfer path. The transfer robot may transfer the semiconductor substrate W on which the cleaning and drying processes are completed back to the loading apparatus 300. In an implementation, the transfer robot may be implemented as a handler.

The supercritical fluid processing apparatus 100 may include a supercritical fluid supply module 110 and an exhaust fluid supply module 120. The supercritical fluid supply module 110 may receive a gaseous fluid from a gas supply and may form a supercritical fluid, and may transfer the supercritical fluid to the process apparatus 200. The exhaust fluid supply module 120 may collect exhaust fluid exhausted from the supercritical fluid supply module 110 and may resupply the exhaust fluid to the supercritical fluid supply module 110. In an implementation, a plurality of the supercritical fluid supply modules 110 and a plurality of the exhaust fluid supply modules 120 may be provided, and a number of exhaust fluid supply modules 120 may be lower than the number of supercritical fluid supply modules 110. In an implementation, the positions of the supercritical fluid supply module 110 and the exhaust fluid supply module 120 and the numbers of the supercritical fluid supply module 110 and the exhaust fluid supply module 120 may be varied in example embodiments.

Referring to FIGS. 1 and 2, an operation of the substrate processing system 1000 may start by loading the semiconductor substrate W to be cleaned and dried through the loading apparatus 300 (S100). The semiconductor substrate W may be loaded from the index apparatus 310 and may be transferred to the standby member 320 by the transfer robot 330. Thereafter, the semiconductor substrate W may be transferred from the standby member 320 to the process apparatus 200 according to a process sequence.

The supercritical fluid supply module 110 may supply the supercritical fluid to the process apparatus 200 to perform the cleaning process and drying process on the semiconductor substrate W transferred to the process apparatus 200 (S200). Accordingly, the supercritical fluid may be provided into the process apparatus 200. The supercritical fluid supply module 110 may discharge at least a portion of the supercritical fluid as an exhaust fluid while performing a process of supplying the supercritical fluid to the process apparatus 200.

The process apparatus 200 may perform a cleaning process or a drying process on the semiconductor substrate W transferred from each of the plurality of process chambers 200a and 200b (S300). The supercritical fluid may be used for at least a portion of the cleaning process or the drying process. The semiconductor substrate W may first be loaded into the cleaning chamber 200a. A chemical solution may be supplied to the surface of the semiconductor substrate W in the cleaning chamber 200a, and the surface of the semiconductor substrate W may be cleaned using the chemical solution. The chemical solution may include, e.g., sulfuric acid, hydrofluoric acid, hydrochloric acid, hydrogen peroxide, or the like. As used herein, the term "or" is not an exclusive term, e.g., "A or B" would include A, B, or A and B. In an implementation, the cleaning process may include removing a resist from the semiconductor substrate W, removing particles or metal impurities, or removing a film formed on the semiconductor substrate W. After the cleaning process is completed, a pure water rinsing process (in which pure water is supplied to the surface of the semiconductor substrate W to rinse the remaining chemical solution), and an alcohol process (in which isopropyl alcohol (IPA) is supplied to the surface of the semiconductor substrate W to dissolve residual pure water to be replaced with alcohol) may be performed. Thereafter, the semiconductor substrate W may be drawn out of the cleaning chamber 200a and may be loaded into the drying chamber 200b. The supercritical fluid may dry isopropyl alcohol (IPA) remaining on the surface of the semiconductor substrate W in the drying chamber 200b. In an implementation, the supercritical fluid may include carbon dioxide in a supercritical state. The semiconductor substrate W may be immersed in the supercritical fluid in the drying chamber 200b for a predetermined period of time.

The substrate processing system 1000 may unload the semiconductor substrate W on which the cleaning process and the drying process have been performed (S400). The semiconductor substrate W may be transferred to the index apparatus 310 and may be unloaded.

Figure 3:
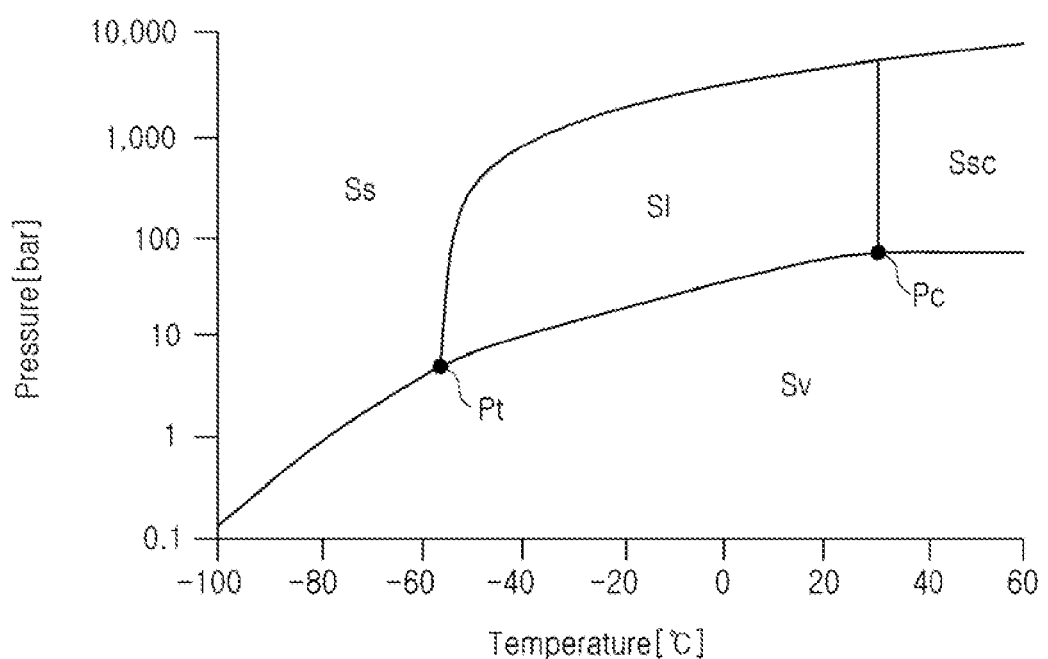
FIG. 3 is a diagram of properties of a fluid used in a substrate processing system according to an example embodiment.

FIG. 3 is a diagram of properties of a fluid used in a substrate processing system according to an example embodiment. FIG. 3 is a state diagram of a relationship between phase, pressure, and temperature of a supercritical fluid, e.g., carbon dioxide, used in the supercritical fluid processing apparatus 100.

Referring to FIG. 3, carbon dioxide may present in a gaseous state Sv, a liquid state Sl, and a solid state Ss.

Each of the states of carbon dioxide may be partitioned into a vapor pressure curve, a sublimation curve, and a dissolution curve. A point in which the vapor pressure curve, the sublimation curve, and the dissolution curve meet may be a triple point Pt.

Carbon dioxide may reach the critical point Pc, which may be the limit at which gas and liquid coexist, when the vapor pressure curve extends from the triple point Pt to the high temperature side. Carbon dioxide may lose distinction between gas and liquid, at a temperature and pressure higher than the critical point Pc and may reach a supercritical state Ssc.

The supercritical fluid may be a fluid compressed to have high density above a critical temperature. The supercritical fluid may have properties of low viscosity and high flow/diffusion properties similar to gases, and may have high density similarly to a liquid. Also, a supercritical fluid may have properties of dissolving various substances similarly to a liquid.

A supercritical fluid may have relatively high wettability as compared to a liquid, and may easily penetrate into a fine structure. Accordingly, the supercritical fluid processing apparatus 100 according to an example embodiment may help prevent damage to the fine pattern on the surface of the semiconductor substrate W by ignoring surface tension of the fluid during the drying process using a supercritical fluid.

The critical temperature at the critical point Pc of carbon dioxide may be 31.1° C., and the critical pressure may be 73.7 bars. Carbon dioxide may reach the critical point Pc at a relatively lower temperature and lower pressure, as compared to other materials usable as a supercritical fluid, the drying process may be easily performed.

Figure 4:
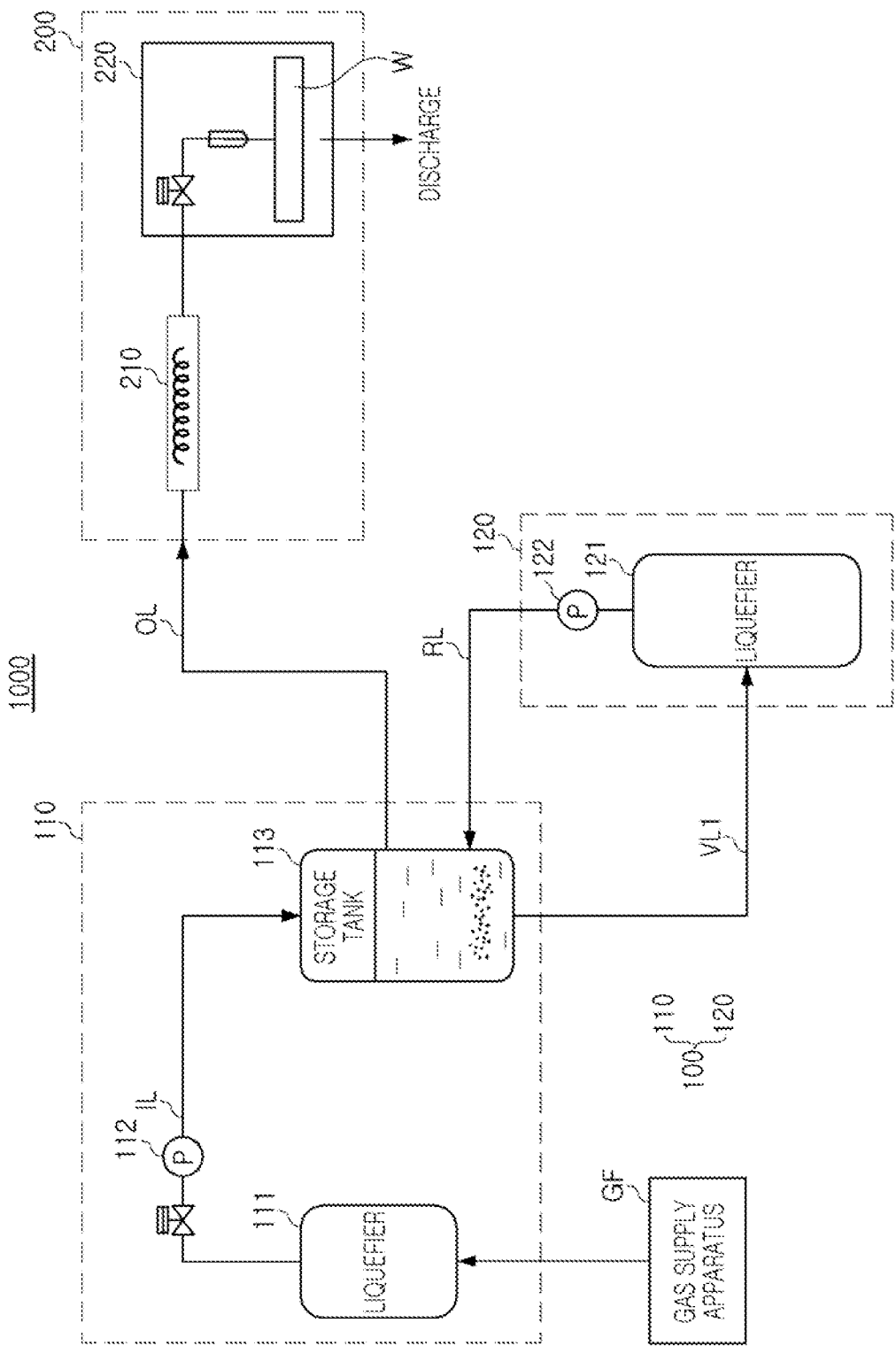
FIG. 4 is a diagram of a substrate processing system according to an example embodiment.
Figure 5:
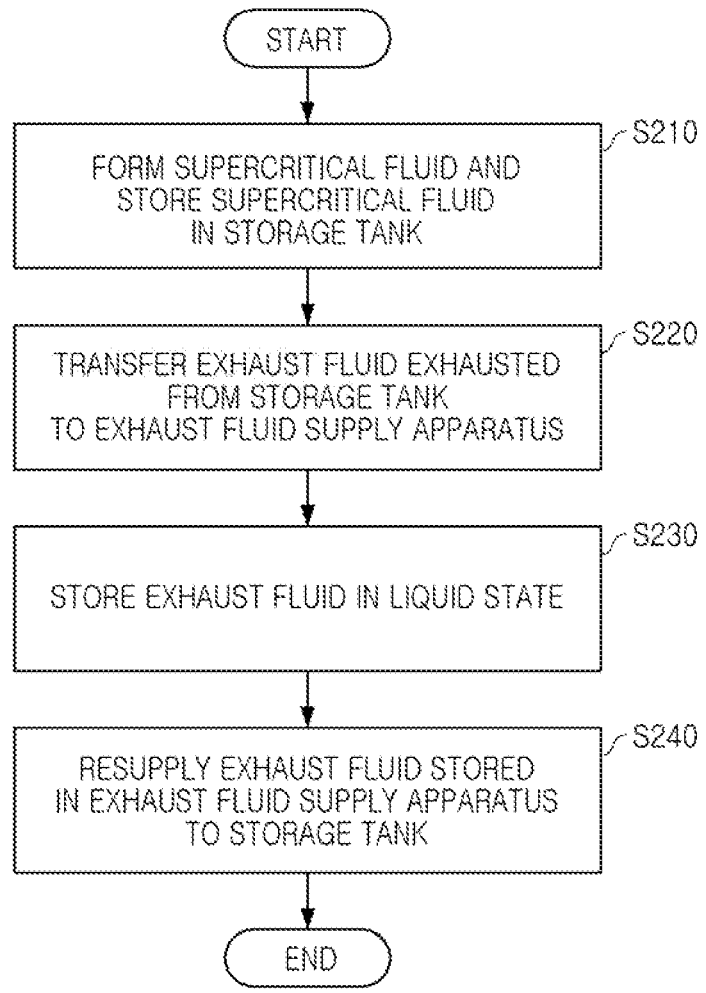
FIG. 5 is a flowchart of operations of a supercritical fluid processing apparatus according to an example embodiment.
Figure 6:
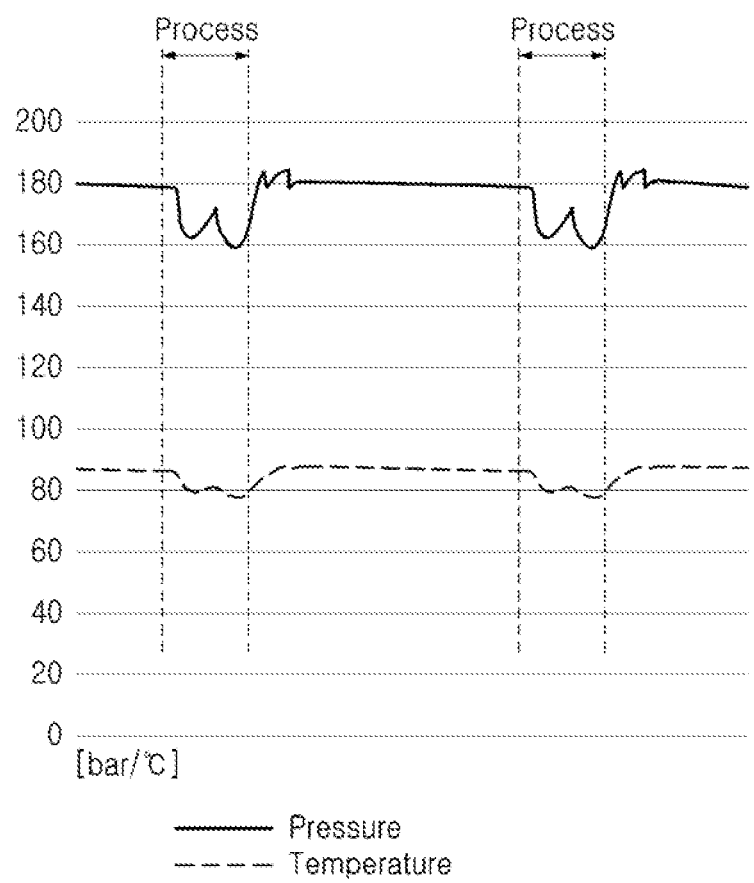
FIG. 6 is a diagram of a pressure and temperature of an exhaust fluid used in a substrate processing system according to an example embodiment.

FIG. 4 is a diagram of a substrate processing system 1000 according to an example embodiment. FIG. 5 is a flowchart of operations of a supercritical fluid processing apparatus 100 according to an example embodiment. FIG. 5 is a flowchart of operations of the supercritical fluid processing apparatus 100 in relation to the operation S200 of supplying a supercritical fluid and discharging an exhaust fluid in FIG. 2. FIG. 6 is a diagram of a temperature and pressure of an exhaust fluid used in a substrate processing system 1000 according to an example embodiment. For example, FIG. 6 illustrates a pressure and temperature drop over time of the exhaust fluid, when the supercritical fluid is used in the cleaning process on the wafer.

Referring to FIG. 4, the substrate processing system 1000 may include a supercritical fluid processing apparatus 100. The supercritical fluid processing apparatus 100 may include a supercritical fluid supply module 110, an exhaust fluid supply module 120, a first exhaust pipe VL1, and a resupply pipe RL.

The supercritical fluid supply module 110 may include a gas liquefier 111, a gas pressure booster 112, an internal pipe IL, and a storage tank 113.

The gas liquefier 111 may include a condenser configured to convert or maintain a gaseous fluid to have a predetermined temperature and predetermined pressure. The predetermined pressure may be, e.g., in the range of about 40 to 60 bars. The gas liquefier 111 may liquefy the fluid transferred from the gas supply GF (e.g., through a gas inlet) that supplies a gaseous fluid.

The storage tank 113 may store a supercritical fluid. The supercritical fluid may be formed by changing the liquefied fluid into a supercritical state by increasing the temperature and pressure of the liquefied fluid. The storage tank 113 may maintain a supercritical fluid at a predetermined temperature and a predetermined pressure. The storage tank 113 may be maintained at a pressure in the range of, e.g., about 160 to about 200 bar. The supercritical fluid stored in the storage tank 113 may be supplied to the process apparatus 200. In an implementation, the supercritical fluid may include carbon dioxide.

The gas pressure booster 112 may be between the gas liquefier 111 and the storage tank 113 and may connect the gas liquefier 111 to the storage tank 113. The gas pressure booster 112 may be configured to increase the pressure of the fluid to transfer the fluid from the gas liquefier 111 to the storage tank 113. By operation of the gas pressure booster 112, the fluid may have a pressure higher than the pressure in the storage tank 113.

The inner pipe IL may connect the gas liquefier 111 to the storage tank 113. The internal pipe IL may be configured to transfer (e.g., may form a path for transferring) the fluid received from the gas supply GF to the storage tank 113.

The exhaust fluid supply module 120 may include an exhaust fluid liquefier 121 and an exhaust fluid pressure booster 122.

The exhaust fluid liquefier 121 may be configured to collect the first exhaust fluid discharged from the supercritical fluid supply module 110 through the first exhaust pipe VL1 and may maintain the first exhaust fluid at a predetermined temperature and pressure. The exhaust fluid liquefier 121 may include a regeneration storage tank configured to collect the first exhaust fluid discharged from the storage tank 113 and a refrigerant pipe configured to liquefy the first exhaust fluid collected in the regeneration storage tank and to change the fluid to have a predetermined temperature and pressure or maintain the fluid at a predetermined temperature and pressure. In an implementation, a condenser may be formed by including the regeneration storage tank and the refrigerant pipe. The regeneration storage tank may have a capacity smaller than the storage tank 113. The exhaust fluid liquefier 121 may be maintained at a pressure in the range of, e.g., about 40 to about 60 bars. The pressure in the storage tank 113 may be higher than the pressure in the exhaust fluid liquefier 121. In an implementation, the first exhaust fluid may include carbon dioxide, and the first exhaust fluid may be the same material as the supercritical fluid stored in the storage tank 113.

The exhaust fluid pressure booster 122 may be configured to transfer the first exhaust fluid collected in the exhaust fluid liquefier 121 from the exhaust fluid supply module 120 to the supercritical fluid supply module 110. In an implementation, the exhaust fluid pressure booster 122 may increase the pressure of the first exhaust fluid and may transfer the first exhaust fluid from the exhaust fluid liquefier 121 to the storage tank 113. The exhaust fluid pressure booster 122 may be between the exhaust fluid liquefier 121 and the storage tank 113. The exhaust fluid pressure booster 122 may be connected to the resupply pipe RL. The exhaust fluid pressure booster 122 may increase the pressure of the first exhaust fluid of the exhaust fluid liquefier 121 and may transfer the first exhaust fluid to the supercritical fluid supply module 110 through the resupply pipe RL. The exhaust fluid pressure booster 122 may increase the pressure of the first exhaust fluid to a pressure higher than the pressure in the storage tank 113. Accordingly, the first exhaust fluid may be transferred to the storage tank 113. The exhaust fluid pressure booster 122 may include a material not reactive with the supercritical fluid, e.g., carbon steel or stainless use steel (SUS).

The first exhaust pipe VL1 may be configured to exhaust the first exhaust fluid from the storage tank 113 to the exhaust fluid liquefier 121. In an implementation, the first exhaust pipe VL1 may transfer the first exhaust fluid discharged from the storage tank 113 to the exhaust fluid liquefier 121. The resupply pipe RL may be configured to resupply the first exhaust fluid from the exhaust fluid liquefier 121 to the storage tank 113. In an implementation, the resupply pipe RL may resupply the first exhaust fluid collected in and liquefied by the exhaust fluid liquefier 121 to the storage tank 113. The first exhaust pipe VL1 and the resupply pipe RL may be separate pipes.

The substrate processing system 1000 may further include a process apparatus 200 and an external pipe OL.

The process apparatus 200 may include a heater 210 and a process chamber 220. The process chamber 220 may refer or correspond to one of the plurality of process chambers 200a and 200b in FIG. 1. The supercritical fluid supply module 110 may supply the supercritical fluid to the process apparatus 200 through the external pipe OL.

The heater 210 may heat the supercritical fluid transferred from the supercritical fluid supply module 110 to have a temperature or equal or greater than a critical temperature. The process apparatus 200 may further include a filter in an area adjacent to the heater 210. The filter may remove particles mixed in the supercritical fluid.

Referring to FIG. 1, the process chamber 220 may be a space, in which the semiconductor substrate W transferred from the loading apparatus 300 is disposed, and the drying process, and the like, in FIG. 1 is performed with the supercritical fluid supplied through the external pipe OL. The first exhaust fluid may include a material different from the supercritical fluid used for the drying process. In an implementation, as the supercritical fluid used for the drying process contains an organic solvent, the supercritical fluid in the storage tank 113 or a material different from the first exhaust fluid may be included. In an implementation, the first exhaust fluid may include carbon dioxide, and the fluid in the process chamber 220 on which the drying process is performed may include carbon dioxide and an organic solvent.

The external pipe OL may be configured to connect the supercritical fluid supply module 110 to the process apparatus 200. That is, the supercritical fluid supply module 110 may be connected to the drying chamber 200b for the drying process through the external pipe OL. The first exhaust fluid may include the same material as the supercritical fluid in the external pipe OL.

Referring to FIGS. 4 and 5, in the supercritical fluid processing apparatus 100 according to an example embodiment, the supercritical fluid supply module 110 may change the gaseous fluid transferred from the gas supply GF into a supercritical state and may form a supercritical fluid, and may store the supercritical fluid in the storage tank 113 (S210). The supercritical fluid stored in the storage tank 113 may be supplied to the apparatus 200 and may be used in the process for the semiconductor substrate W.

The first exhaust fluid formed by discharging at least a portion of the supercritical fluid from the storage tank 113 of the supercritical fluid supply module 110 may be transferred to the exhaust fluid supply module 120 (S220). The first exhaust fluid may be transferred to the exhaust fluid liquefier 121 of the exhaust fluid supply module 120 through the first exhaust pipe VL1. The first exhaust fluid may be formed by discharging at least a portion of the supercritical fluid externally of the storage tank 113 according to a change in pressure in the storage tank 113. The change in pressure may be generated by increasing the pressure in the storage tank 113 more than a decrease in pressure in the storage tank 113 generated as the supercritical fluid is transferred from the storage tank 113 to the process apparatus 200. The first exhaust fluid may be transferred to the exhaust fluid liquefier 121 of the exhaust fluid supply module 120 through the first exhaust pipe VL1. In an implementation, the pressure in the storage tank 113 may be higher than the pressure in the exhaust fluid liquefier 121, such that the first exhaust fluid may be transferred to the exhaust fluid liquefier 121 without another boosting apparatus. In an implementation, another pressure adjustment apparatus may be included on the first exhaust pipe VL1.

The first exhaust fluid may be collected and stored in the regeneration storage tank of the exhaust fluid liquefier 121 (S230). The first exhaust fluid may be stored as a liquid under a constant pressure in the exhaust fluid liquefier 121. The constant pressure may be in the range of, e.g., about 40 to 60 bars.

The first exhaust fluid stored in the exhaust fluid liquefier 121 of the exhaust fluid supply module 120 may be resupplied to the storage tank 113 (S240). The first exhaust fluid may be transferred to the storage tank 113 through the resupply pipe RL.

In an implementation, the first exhaust fluid may include carbon dioxide and may include the same material as the supercritical fluid stored in the storage tank 113. In an implementation, the first exhaust fluid may be a material for collecting and resupplying a material from which at least a portion of the supercritical fluid in the storage tank 113 is exhausted to the exhaust fluid supply module 120 without reacting with another compound, such that the first exhaust fluid may be the same as the supercritical fluid. Accordingly, the first exhaust fluid may be supplied back into the storage tank 113 without reducing the purity of the supercritical fluid in the storage tank 113, thereby improving the supply efficiency of the supercritical fluid supply module 110. In an implementation, the supercritical fluid processing apparatus 100 in which carbon emission is reduced may be provided by recollecting the first exhaust fluid discharged to the external environment.

Referring to FIGS. 4 and 6, the inside of the storage tank 113 of the supercritical fluid supply module 110 may be maintained at a predetermined temperature and pressure, which may be to constantly maintain the state of the supercritical fluid to be provided to the process apparatus 200. The storage tank 113 may be maintained at, e.g., a pressure of 180 bars and a temperature of 80° C. The pressure in the storage tank 113 may have a pressure deviating from the predetermined pressure under predetermined conditions.

In an implementation, one of the predetermined conditions may be to open a port of the storage tank 113 connected to the external pipe OL such that the supercritical fluid supply module 110 may supply the supercritical fluid to the process apparatus 200. In a process in which the supercritical fluid supply module 110 transfers the supercritical fluid to the external pipe OL for the drying process for the semiconductor substrate W, the pressure in the storage tank 113 may decrease. In an implementation, as the supercritical fluid flows out of the storage tank 113, the pressure in the storage tank 113 may be lower than the predetermined pressure. In the storage tank 113, overshooting may occur in the process of increasing the internal pressure of the storage tank 113, which may be reduced to maintain the predetermined pressure, such that the pressure may be higher than the predetermined pressure. Accordingly, the first exhaust fluid may be discharged through the first exhaust pipe VL1.

In an implementation, one of the predetermined conditions may refer to an increase of the pressure further than the predetermined pressure as overshooting occurs due to heating and increasing pressure when the temperature decreases in the process of PID control (proportional-integral-differential control) to maintain the inside of the storage tank 113 at the predetermined temperature and pressure.

The storage tank 113 may include a discharge port connected to the first exhaust pipe VL1. The discharge port may be automatically opened when the internal pressure of the storage tank 113 is higher than the predetermined pressure under the predetermined conditions, and the first exhaust fluid may be transferred to the first exhaust pipe VL1 by a difference in pressures, or the opening and closing of the discharge port may be independent of the difference in pressures.

Figure 7:
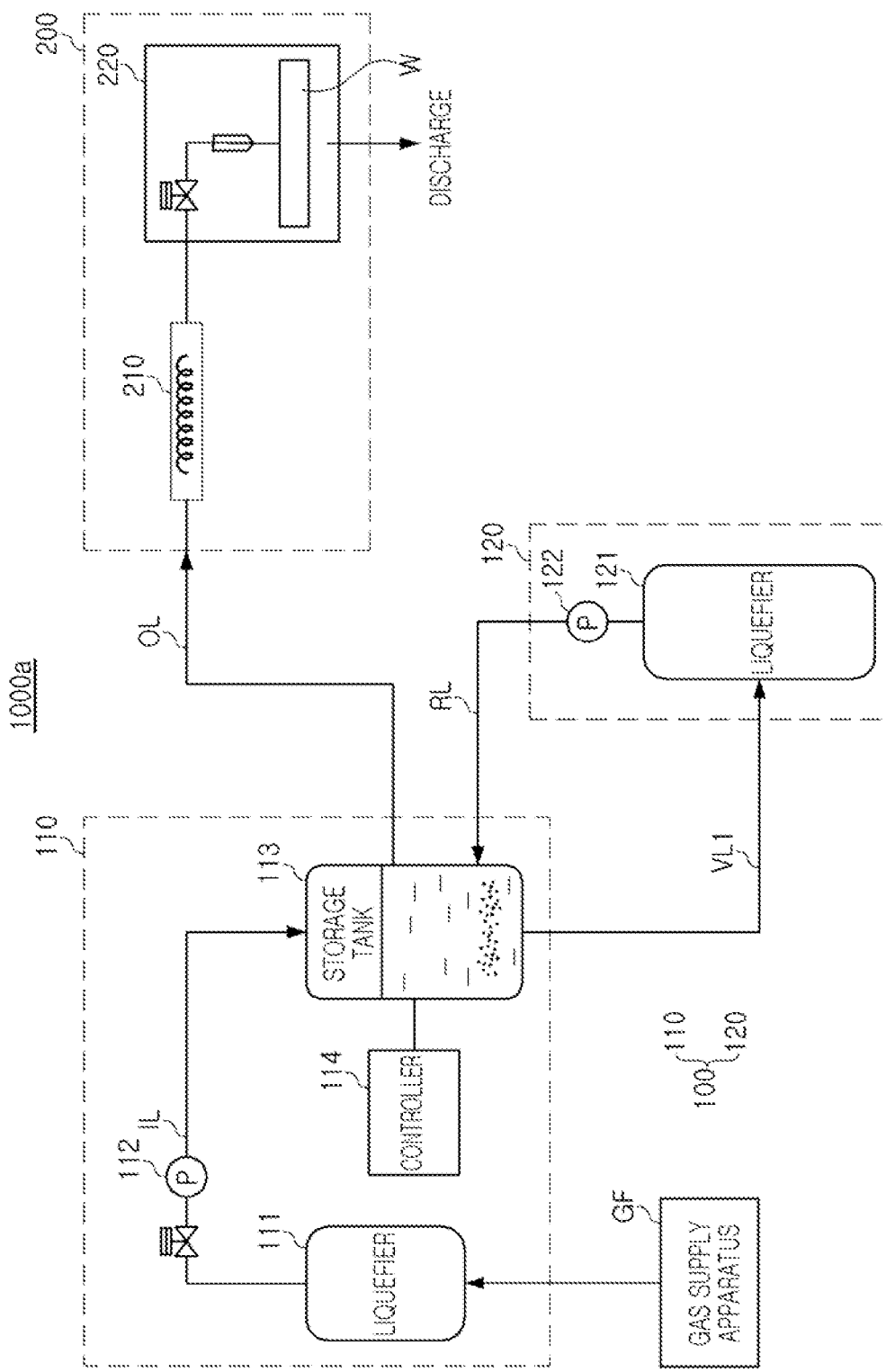
FIG. 7 is a diagram of a substrate processing system according to an example embodiment.

FIG. 7 is a diagram of a substrate processing system 1000a according to an example embodiment.

Referring to FIG. 7, the substrate processing system 1000a may further include a controller 114 of the supercritical fluid supply module 110. The controller 114 may control the discharge of the first exhaust fluid from the storage tank 113 to the first exhaust pipe VL1 connected to the exhaust fluid supply module 120.

The storage tank 113 may further include a discharge port connected to the first exhaust pipe VL1. The controller 114 may be configured to control the opening and closing of the discharge port. Referring to FIG. 6, the controller 114 may be configured to control the opening and closing of the discharge port by sensing changes in the pressure in the storage tank 113 under the predetermined condition. In an implementation, the controller 114 may also perform a function of independently controlling the opening and closing of the discharge port regardless of a change in pressure.

Figure 8:
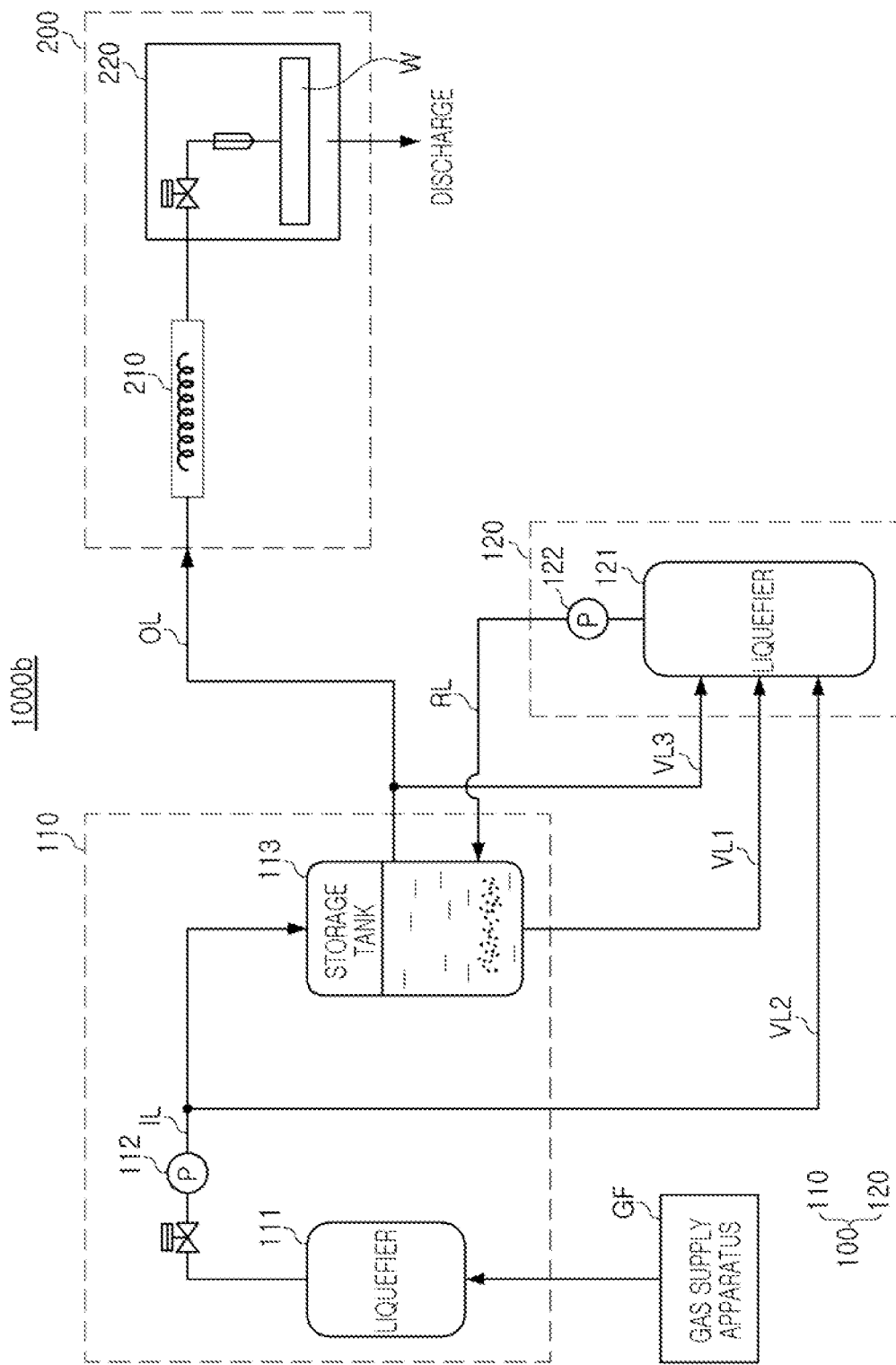
FIG. 8 is a diagram of a substrate processing system according to an example embodiment.

FIG. 8 is a diagram of a substrate processing system according to an example embodiment.

Referring to FIG. 8, the substrate processing system 1000b may further include a second exhaust pipe VL2 for discharging a second exhaust fluid and a third exhaust pipe VL3 for discharging a third exhaust fluid. The exhaust fluid may include the first exhaust fluid, the second exhaust fluid, and the third exhaust fluid. As used herein, the terms "first," "second," and the like are merely for identification and differentiation, and are not intended to imply or require sequential inclusion (e.g., a third element and a fourth element may be described without implying or requiring the presence of a first element or second element).

The second exhaust pipe VL2 may connect the internal pipe IL to the exhaust fluid liquefier 121. The second exhaust pipe VL2 may transfer (e.g., may form a path for transferring) the second exhaust fluid discharged from the internal pipe IL to the exhaust fluid liquefier 121. The exhaust fluid liquefier 121 may collect the second exhaust fluid together with the first exhaust fluid. The second exhaust fluid may be formed by discharging the supercritical fluid of the internal pipe IL for discharge in an emergency situation in the supercritical fluid supply module 110 or discharge for inspection.

The third exhaust pipe VL3 may connect the external pipe OL and the exhaust fluid liquefier 121. The third exhaust pipe VL3 may transfer (e.g., may form a path for transferring) the third exhaust fluid discharged from the external pipe OL to the exhaust fluid liquefier 121. The exhaust fluid liquefier 121 may collect the third exhaust fluid together with the first exhaust fluid. The third exhaust fluid may be formed by discharging the supercritical fluid of the external pipe OL to reduce the pressure of the external pipe OL after the process apparatus 200 performs the cleaning process and the drying process.

In an implementation, the substrate processing system 1000b may further include the controller 114 of FIG. 7. The controller 114 may control the discharge of the first exhaust fluid of the first exhaust pipe VL1 along with the discharge of the second exhaust fluid of the second exhaust pipe VL2 and the third exhaust fluid of the third exhaust pipe VL3.

Figure 9:
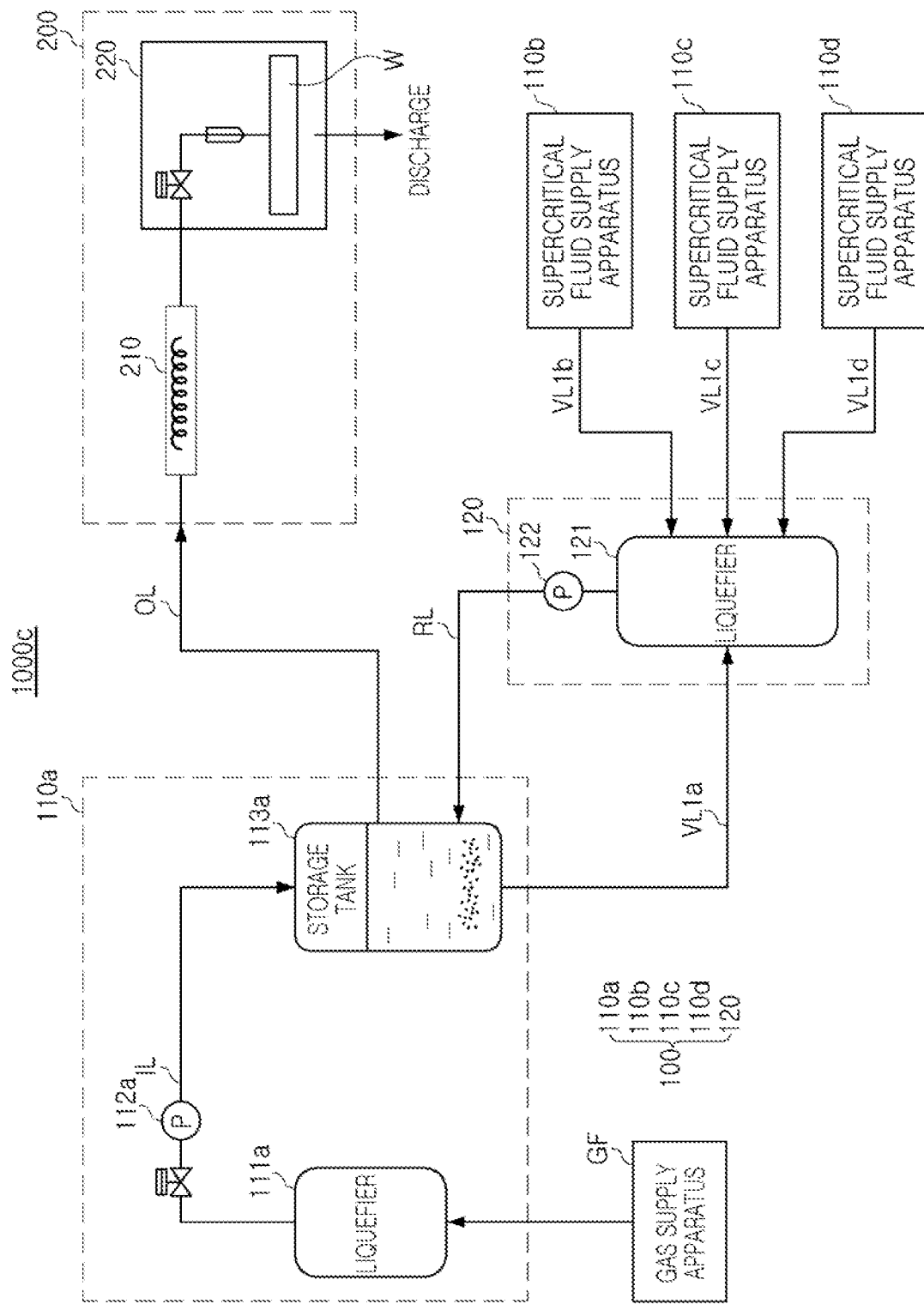
FIG. 9 is a diagram of a substrate processing system according to an example embodiment.

FIG. 9 is a diagram of a substrate processing system 1000c according to an example embodiment.

Referring to FIG. 9, the substrate processing system 1000c may include a plurality of supercritical fluid supply modules 110a, 110b, 110c, and 110d and may include a single exhaust fluid supply module 120. The first exhaust fluid discharged from each of the storage tanks of the plurality of supercritical fluid supply modules 110a, 110b, 110c, and 110d may be stored in the single exhaust fluid liquefier 121. Referring to FIG. 6, the first exhaust fluid may be formed by discharging the supercritical fluid by increasing the pressure in the storage tank 113, which may be reduced by discharging the supercritical fluid from the storage tank 113 to perform the drying process. The amount of the first exhaust fluid may be, e.g., in the range of about 0.1 kg to about 0.2 kg with respect to a single drying process, which may be a significantly less than the amount of the supercritical fluid stored in the storage tank 113. Accordingly, the first exhaust fluid discharged from the plurality of supercritical fluid supply modules 110a, 110b, 110c, and 110d may be collected and reused in the single exhaust fluid liquefier 121. In an implementation, the number of the plurality of supercritical fluid supply modules 110a, 110b, 110c, and 110d may be varied depending on the amount of the first exhaust fluid which the single exhaust fluid liquefier 121 may collect.

Figure 10:
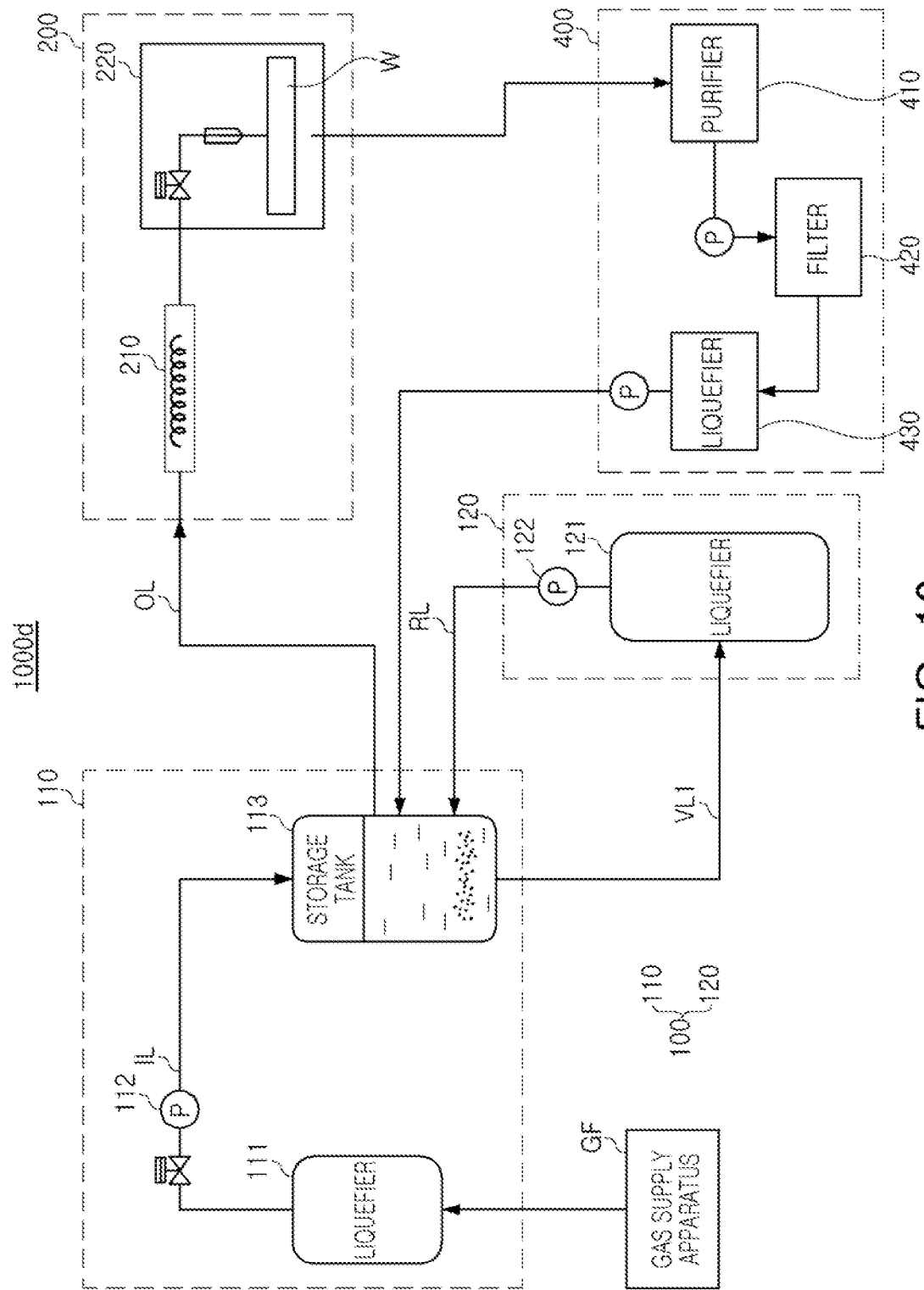
FIG. 10 is a diagram of a substrate processing system according to an example embodiment.

FIG. 10 is a diagram of a substrate processing system according to an example embodiment.

Referring to FIG. 10, the substrate processing system 1000d may further include a regeneration unit or regenerator 400. The regenerator 400 may include a purifier 410, a filter 420, and a liquefier 430, and may further include a pressure booster. The regenerator 400 may be connected to the process apparatus 200 and the supercritical fluid supply module 110. The regenerator 400 may be between the process apparatus 200 and the supercritical fluid supply module 110. The supercritical fluid used for the cleaning process and the drying process from the process apparatus 200 may contain an organic solvent. Accordingly, the supercritical fluid containing the organic solvent transferred from the process apparatus 200 to the regenerator 400 may include a material different from the supercritical fluid in the storage tank 113.

The purifier 410 and the filter 420 may be configured to separate the organic solvent from the supercritical fluid containing the organic solvent. In an implementation, the purifier 410 may primarily separate the organic solvent from the supercritical fluid by liquefying the organic solvent by cooling the supercritical fluid containing the organic solvent. In an implementation, the filter 420 may be a space in which an adsorbent for absorbing the organic solvent may be provided, and may secondarily separate the organic solvent from the supercritical fluid. As the supercritical fluid containing the organic solvent passes through the purifier 410 and the filter 420, the organic solvent may be separated such that the purity of the supercritical fluid may increase, as compared to before the supercritical fluid passes through the purifier 410 and the filter 420. The liquefier 430 may be configured to store and maintain the supercritical fluid passing through the purifier 410 and the filter 420 in a liquid state, and to resupply the supercritical fluid to the storage tank 113.

Differently from the exhaust fluid supply module 120, the regenerator 400 may be configured to reuse the supercritical fluid used for the drying process of the process apparatus 200. Accordingly, the regenerator 400 may process and reuse a large amount of the supercritical fluid, as compared to the exhaust fluid supply module 120, whereas an additional apparatus such as a purifier may be necessary, such that a relatively large space may be necessary, and the purity of the supercritical fluid stored in the storage tank 113 may decrease. The exhaust fluid supply module 120 may maintain a high-purity supercritical state even when a relatively small amount of exhaust fluid is reused, and the exhaust fluid supply module 120 may be in a relatively small space using an existing apparatus.

By way of summation and review, to address an issue in which the pattern formed on the surface of a wafer could be damaged by surface tension of a liquid, a drying process may be performed using a supercritical fluid.

According to the aforementioned example embodiments, the supercritical fluid processing apparatus may, by including an exhaust fluid supply module for collecting and resupplying the exhaust fluid discharged from the supercritical fluid supply module, provide a high-purity supercritical fluid, thereby improving the supply efficiency of the supercritical fluid supply module and reducing the exhaust fluid that is discharged externally.

One or more embodiments may provide a supercritical fluid processing apparatus including a supercritical fluid supply module which may have improved supply efficiency and may address environmental issues of exhaust fluid discharged externally.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A supercritical fluid processing apparatus, comprising:
   at least one supercritical fluid supply module including:
      a gas liquefier configured to liquefy a gaseous fluid transferred from a gas supply and provide a liquefied fluid,
      a storage tank configured to change the liquefied fluid to have a supercritical state and to store a supercritical fluid, and
      an internal pipe connecting the gas liquefier to the storage tank;
   an exhaust fluid supply module including:
      an exhaust fluid liquefier including a regeneration storage tank configured to collect a first exhaust fluid discharged from the storage tank, and
      a refrigerant pipe configured to liquefy the first exhaust fluid collected in the regeneration storage tank and to maintain the liquefied first exhaust fluid at a predetermined temperature and pressure;
   a first exhaust pipe configured to transfer the first exhaust fluid discharged from the storage tank to the exhaust fluid liquefier; and a resupply pipe configured to resupply the first exhaust fluid collected and liquefied in the exhaust fluid liquefier to the storage tank,
wherein a pressure in the storage tank is higher than a pressure in the exhaust fluid liquefier, and
wherein the exhaust fluid supply module further includes an exhaust fluid pressure booster connected to the resupply pipe and configured to transfer the first exhaust fluid from the exhaust fluid supply module to the at least one supercritical fluid supply module.

2. The supercritical fluid processing apparatus as claimed in claim 1, wherein:
the exhaust fluid liquefier is maintained at a pressure in a range of about 40 to about 60 bars, and
the storage tank is maintained at a pressure in a range of about 160 to about 200 bars.

3. The supercritical fluid processing apparatus as claimed in claim 1, wherein:
the first exhaust fluid includes carbon dioxide, and
the first exhaust fluid is the same material as the supercritical fluid stored in the storage tank.

4. The supercritical fluid processing apparatus as claimed in claim 1, wherein the at least one supercritical fluid supply module is connected to a drying chamber for a drying process through an external pipe.

5. The supercritical fluid processing apparatus as claimed in claim 4, wherein the first exhaust fluid includes the same material as the supercritical fluid in the external pipe, and includes a material different from the supercritical fluid on which the drying process is performed in the drying chamber.

6. The supercritical fluid processing apparatus as claimed in claim 5, further comprising a third exhaust pipe configured to transfer a third exhaust fluid discharged from the external pipe to the exhaust fluid liquefier,
wherein the exhaust fluid liquefier collects the first exhaust fluid and the third exhaust fluid.

7. The supercritical fluid processing apparatus as claimed in claim 1, wherein the at least one supercritical fluid supply module further includes:
a discharge port connecting the storage tank to the first exhaust pipe, and
a controller configured to control opening and closing of the discharge port.

8. The supercritical fluid processing apparatus as claimed in claim 7, wherein the controller is configured to sense a change in pressure in the storage tank and to control opening and closing of the discharge port in response to the change in pressure.

9. The supercritical fluid processing apparatus as claimed in claim 1, further comprising a second exhaust pipe configured to transfer a second exhaust fluid discharged from the internal pipe to the exhaust fluid liquefier,
wherein the exhaust fluid liquefier collects the first exhaust fluid and the second exhaust fluid.

10. The supercritical fluid processing apparatus as claimed in claim 1, wherein:
the at least one supercritical fluid supply module includes a plurality of supercritical fluid supply modules, and
the first exhaust fluid discharged from the storage tank of each of the plurality of supercritical fluid supply modules is collected in the exhaust fluid liquefier.

11. A substrate processing system, comprising:
a process apparatus configured to perform cleaning and drying processes on a substrate; and
a supercritical fluid processing apparatus including:

a supercritical fluid supply module configured to supply a supercritical fluid to the process apparatus through an external pipe and including at least one storage tank configured to store the supercritical fluid, and
an exhaust fluid supply module including:
an exhaust fluid liquefier configured to collect a first exhaust fluid discharged from the supercritical fluid supply module through a first exhaust pipe and to maintain the first exhaust fluid at a predetermined temperature and pressure, and
an exhaust fluid pressure booster configured to transfer the first exhaust fluid collected in the exhaust fluid liquefier to the supercritical fluid supply module through a resupply pipe,
wherein, a pressure in the storage tank is higher than a pressure in the exhaust fluid liquefier.

12. The substrate processing system as claimed in claim 11, wherein the supercritical fluid supply module further includes:
a gas inlet to which a gaseous fluid is supplied,
a gas liquefier configured to liquefy the gaseous fluid,
an internal pipe connecting the gas liquefier to the at least one storage tank, and
a controller configured to control discharge of the supercritical fluid in the at least one storage tank to the first exhaust pipe.

13. The substrate processing system as claimed in claim 12, further comprising:
a second exhaust pipe connecting the internal pipe to the exhaust fluid supply module; and
a third exhaust pipe connecting the external pipe to the exhaust fluid supply module,
wherein the first exhaust pipe connects the at least one storage tank to the exhaust fluid supply module, and
wherein the exhaust fluid liquefier collects the first exhaust fluid, a second exhaust fluid discharged through the second exhaust pipe, and a third exhaust fluid discharged through the third exhaust pipe.

14. The substrate processing system as claimed in claim 11, wherein:
the at least one storage tank includes a plurality of storage tanks, and
the exhaust fluid supply module collects the first exhaust fluid discharged from the plurality of storage tanks.

15. The substrate processing system as claimed in claim 14, wherein the first exhaust fluid is collected in a single exhaust fluid liquefier.

16. The substrate processing system as claimed in claim 11, wherein:
the supercritical fluid stored in the at least one storage tank and the first exhaust fluid collected in the exhaust fluid supply module include carbon dioxide, and
a fluid in the process apparatus which performs the drying process includes carbon dioxide and an organic solvent.

17. A substrate processing system, comprising:
a loading apparatus configured to prepare a substrate to be processed;
a process apparatus including:
a cleaning chamber configured to perform a cleaning process on the substrate, and
a drying chamber configured to perform a drying process on the substrate;
a supercritical fluid processing apparatus configured to store and supply a supercritical fluid for performing the cleaning process and the drying process; and
an external pipe connecting the process apparatus to the supercritical fluid processing apparatus, wherein the supercritical fluid processing apparatus includes:
at least one supercritical fluid supply module including:
    a gas liquefier configured to liquefy a gaseous fluid transferred from a gas supply and provide a liquefied fluid,
    a storage tank configured to change the liquefied fluid to have a supercritical state and to store a supercritical fluid, and
    an internal pipe connecting the gas liquefier to the storage tank;
an exhaust fluid supply module including:
    an exhaust fluid liquefier including a regeneration storage tank configured to collect a first exhaust fluid discharged from the storage tank, and
    a refrigerant pipe configured to liquefy the first exhaust fluid collected in the regeneration storage tank and to maintain the liquefied first exhaust fluid at a predetermined temperature and pressure, and an exhaust fluid pressure booster configured to transfer the first exhaust fluid from the exhaust fluid liquefier to the at least one supercritical fluid supply module;
a first exhaust pipe configured to supply the first exhaust fluid from the storage tank to the exhaust fluid liquefier; and
a resupply pipe configured to resupply the first exhaust fluid from the exhaust fluid liquefier to the storage tank.

18. The substrate processing system as claimed in claim 17, further comprising:
a second exhaust pipe connecting the internal pipe to the exhaust fluid supply module; and
a third exhaust pipe connecting the external pipe to the exhaust fluid supply module,
wherein the first exhaust pipe connects the storage tank to the exhaust fluid supply module, and
wherein the exhaust fluid liquefier collects the first exhaust fluid, a second exhaust fluid discharged through the second exhaust pipe, and a third exhaust fluid discharged through the third exhaust pipe.

19. The substrate processing system as claimed in claim 17, wherein:
the at least one supercritical fluid supply module includes a plurality of supercritical fluid supply modules, and
the regeneration storage tank stores the first exhaust fluid discharged from the plurality of supercritical fluid supply modules.

* * * * *